United States Patent
Lee

(10) Patent No.: US 6,998,287 B2
(45) Date of Patent: Feb. 14, 2006

(54) POLYCRYSTALLINE LIQUID CRYSTAL DISPLAY DEVICE HAVING LARGE WIDTH CHANNEL AND METHOD OF FABRICATING THE SAME

(75) Inventor: Seok-Woo Lee, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/875,545

(22) Filed: Jun. 25, 2004

(65) Prior Publication Data

US 2005/0139918 A1 Jun. 30, 2005

(30) Foreign Application Priority Data

Dec. 29, 2003 (KR) .................. 10-2003-0099354

(51) Int. Cl.
*H01L 21/00* (2006.01)
(52) U.S. Cl. ..................................... 438/48
(58) Field of Classification Search ............... 438/487, 438/166, 149, 48; 349/149, 113, 42, 40; 257/67, 66, 59, 49, 618, 368, 72, 347
See application file for complete search history.

(56) References Cited

U.S. PATENT DOCUMENTS 5,229,643 A * 7/1993 Ohta et al. .................. 257/706
2002/0053672 A1 * 5/2002 Yamazaki et al. ............ 257/66

* cited by examiner

*Primary Examiner*—Laura M. Schillinger
*Assistant Examiner*—Monica D. Harrison
(74) *Attorney, Agent, or Firm*—Morgan, Lewis & Bockius LLP

(57) ABSTRACT

A polysilicon liquid crystal display (LCD) device having a large width channel includes a buffer layer formed on a substrate, an active layer formed on the buffer layer and having a plurality of heat releasing parts, a gate line formed in a width direction of the active layer, at least one heat releasing path formed in each of the plurality of heat releasing parts, source and drain electrodes symmetrically formed at both sides of the active layer, and a contact hole connecting the source and drain electrodes and the active layer.

12 Claims, 5 Drawing Sheets

POLYCRYSTALLINE LIQUID CRYSTAL DISPLAY DEVICE HAVING LARGE WIDTH CHANNEL AND METHOD OF FABRICATING THE SAME

This application claims the benefit of the Korean Application No. P2003-99354 filed on Dec. 29, 2003, which is hereby incorporated by reference.

BACKGROUND OF THE INVENTION

1. Field of the Invention

The present invention relates to a liquid crystal display (LCD) device and method of fabricating thereof, and more particularly, to a polycrystalline LCD device having a large width channel and a method of fabricating the same.

2. Description of the Related Art

There are various kinds of screen display devices displaying image data on a screen. Among those, a thin film type flat-panel display device has been mainly developed because of its advantages of being light weight and portable. Moreover, an LCD device has high resolution and high operating speed to accomplish moving pictures. The LCD device utilizes liquid crystal arranged by an electric field applied thereto to transmit or cut off light by the direction of alignment.

Recently, an active matrix type LCD device has been widely developed to provide excellent picture quality, in which a plurality of pixels are arranged in a matrix form and image data are selectively supplied to each pixel through a switching device such as a thin film transistor (TFT) provided at each pixel. The LCD device includes a TFT array substrate made of a transparent material, for example, a glass material incurring low cost and having high processibility.

Crystalline silicon is utilized as a channel of the transistor because of its high speed operation characteristics. However, if the channel is fabricated with a polycrystalline silicon material having high electron mobility, a switching speed may be high and a size may be designed to be small. But since the polycrystalline silicon is formed through a high temperature process, it cannot be formed on the glass substrate of the LCD device. Therefore, the TFT applied on the glass substrate of the LCD device is made of silicon so that it may be formed through a low temperature process.

Also, the LCD device includes a driving circuit unit that requires numerous switching devices to process digital signals. For this reason, the driving circuit unit is configured with a plurality of integrated circuits (IC) in which small transistors having high switching speed are integrated at high density. Thus, the transistors applied to the driving circuit unit of the LCD device are to be made of the polycrystalline silicon material through the high temperature process.

As mentioned above, the TFT applied to the pixel region of the LCD device is made of the amorphous silicon material, whereas the transistor applied to the driving circuit unit of the LCD device is made of the polycrystalline silicon through the high temperature process. Accordingly, as for the driving circuit unit of the LCD device, a plurality of ICs are individually fabricated on the single-crystalline silicon substrate and then can be mounted on a tape carrier package (TCP) so as to be connected to the substrate of the LCD device in a tape automated bonding (TAB) method, or can be mounted on the substrate of the LCD device so as to be coupled to the substrate in a chip on-glass (COG) method.

However, if the driving circuit unit is coupled to the substrate in the TAP or the COG method, space is required for the driving circuit unit, causing the compact size of the LCD device to increase the simple construction of the device to become more complicated. In addition, various noises or electromagnetic interference (EMI) are generated due to the increase in the number and length of lines transmitting driving signals, resulting in degradation reliability of a product and increase in fabrication unit cost of the LCD device.

Recently, as the research and development for forming the polycrystalline silicon through the low temperature process proceed, the TFT formed on the substrate of the LCD device can be made of the polycrystalline silicon material, and a driving circuit-integrated LCD device has been proposed in which the driving circuit unit can be installed on the substrate of the LCD device.

FIG. 1 is an exemplary view showing a driving circuit-integrated LCD device according to related art. As shown in FIG. 1, an LCD device includes an LCD panel 10 where gate lines 20 are arranged horizontally and at regular intervals, data lines 30 are arranged vertically and at regular intervals, and pixels 40 are formed at square regions sectioned as the gate lines 20 and data lines 30 intersect; a gate driving circuit unit 50 mounted on the LCD panel 10 and applying scan signals to the gate lines 20, and a data driving circuit unit 60 mounted on the LCD panel 10 and applying data signals to the data lines 30.

Each of the pixels 40 includes a pixel electrode and a TFT. The TFT includes a gate electrode connected to the gate line 20, a source electrode connected to the data line 30 and a drain electrode connected to the pixel electrode. Gate pad parts and data pad parts are formed at ends of the gate and data lines 20, 30.

The gate driving circuit unit 50 sequentially applies scan signals to the gate lines 20 through the gate pad parts, and the data driving circuit unit 60 applies data signals to the data lines 30 through the data pad parts to individually drive the pixels 40 of the LCD panel 10, thereby displaying an image on the LCD panel 10. Also, the gate driving circuit unit 50 and the data driving circuit unit 60 mounted on the LCD panel 10 are simultaneously formed during a process of fabricating a TFT array substrate of the LCD panel 10.

As discussed above, since the driving circuit-integrated LCD device has increasingly high resolution and is enlarged, the number of data signals to be processed for driving the LCD device is considerably increased. Accordingly, the driving circuit unit of the LCD device should be driven at a higher speed. However, loads of the data lines and the gate lines are increased so much that it is impossible to apply a desired signal within a short time.

For this reason, a high resolution and large-scale LCD device needs a transistor with a channel having a large width at an output buffer so as to apply a desired signal quickly corresponding to the loads of the data and gate lines. However, the transistor that operates at a high speed and has a large width has a problem that the transistor becomes hot due to the movement of numerous carriers and data processing. In some situations, the temperature of an element may go up to 300° C. so that the element is degraded and cannot be driven normally because of a change in a threshold voltage.

In order to solve this problem, the channel of the transistor with a large width is designed to be sectioned to several parts to promote heat releasing. As shown in FIG. 2, an active layer 100 is formed on a buffer layer of the glass substrate, and includes a plurality of cut-out portions 90 to release heat generated from the channel. A gate line 20 is formed at the central portion of the active layer 100 and supplies a gate scan signal to the channel. Source and drain electrodes 70, 80 are formed at both sides of the active layer 100 to be connected to the active layer 100 through contact holes 70a, 80a.

The structure of the large-width transistor above is helpful for heat releasing. However, since the structure it utilizes a silicon oxide film, which has very low heat conductivity, as an interlayer insulation layer for separating the gate line 20 and the source and drain electrodes 70, 80, the heat releasing is interrupted when the device is heated. In addition, when devices used for the driving circuit unit become more fast, even the above-described structure of the transistor will have only a limited role in solving the degradation of the devices.

SUMMARY OF THE INVENTION

Therefore, one object of the present invention is to solve the heating problem caused by a large width transistor applied to a driving circuit unit of an LCD device with a high operation speed.

Another object of the present invention is to prevent degradation of a device and release of heat efficiently from the driving circuit unit of the LCD device.

To achieve these and other advantages and in accordance with the purpose of the present invention, as embodied and broadly described herein, there is provided a polysilicon LCD device having a large width channel, including a buffer layer formed on a substrate, an active layer formed on the buffer layer and having a plurality of heat releasing parts, a gate line formed in a width direction of the active layer, at least one heat releasing path formed in each of the plurality of heat releasing parts, source and drain electrodes symmetrically formed at both sides of the active layer, and a contact hole connecting the source and drain electrodes and the active layer.

In another aspect, a method of forming the polysilicon LCD device includes forming a buffer layer on a substrate, forming an active layer having at least one heat releasing part on the buffer layer, forming a first insulation layer on the active layer, forming a gate line on the first insulation layer, forming a second insulation layer on the gate line, forming at least one heat releasing path and at least one contact hole on the second insulation layer, forming source and drain electrodes connected to the active layer through the contact hole, and forming a passivation layer connected to the heat releasing part through the heat releasing path.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
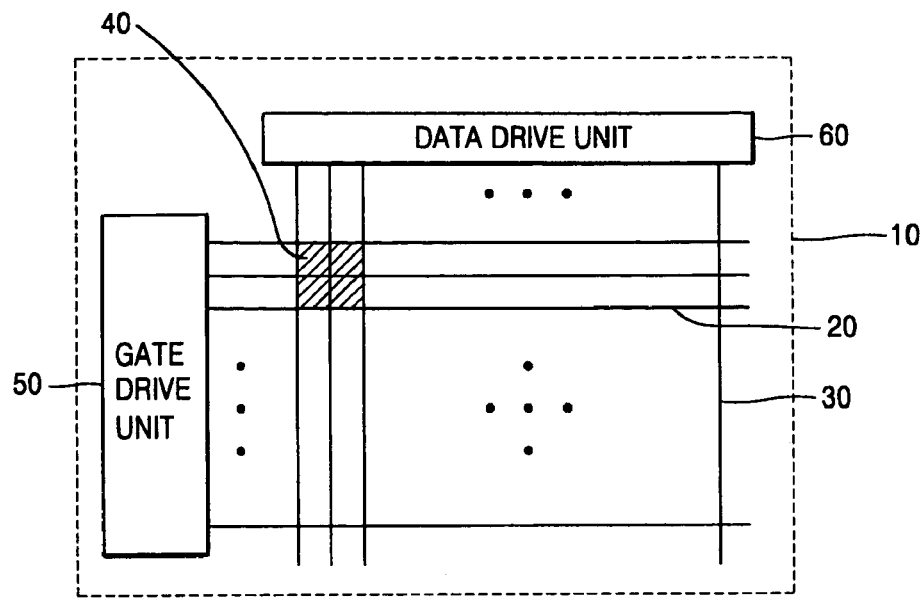
FIG. 1 is schematic view showing an exemplary driving circuit-integrated LCD device according to the related art.
Figure 2:
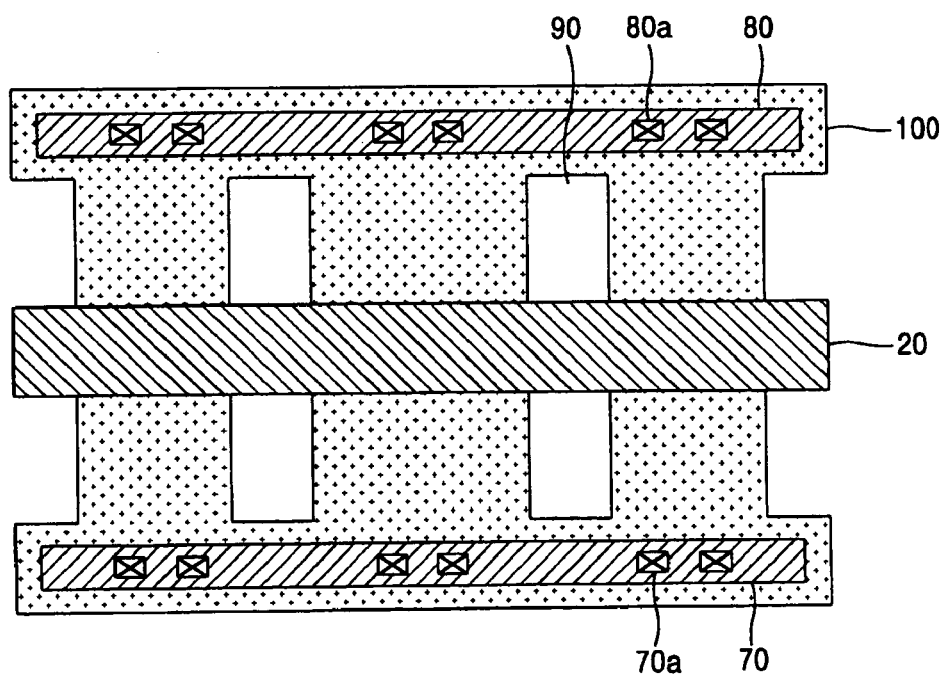
FIG. 2 is a plan view showing a large width transistor applied to the driving circuit unit of FIG. 1.

Reference will now be made in detail to the preferred embodiments of the present invention, examples of which are illustrated in the accompanying drawings.

Generally speaking, if an LCD device is enlarged, a driving circuit unit of the LCD device must operate at a high speed so as to drive a moving picture. Accordingly, an LCD device employing polysilicon as a channel, which has far superior electric mobility to amorphous silicon, has been proposed. However, the polysilicon LCD device has a self-heating problem due to its high speed operation characteristics. Therefore, it is important to effectively release heat generated from a large width transistor adopting polysilicon as a channel. In order to achieve this object, a portion of a buffer layer adjacent to a channel layer is formed of a silicon nitride film having excellent heat conductivity, a heat releasing path is formed at a heat releasing part formed in the active layer, and the silicon nitride film of the buffer layer and a passivation layer having excellent heat conductivity are connected through the heat releasing path, thereby effectively releasing the heat generated from the channel during its operation through the heat releasing path and the passivation layer.

A structure of the large width transistor in accordance with the present invention will now be described with reference to FIG. 3. The large width transistor is formed such that a width of a channel layer has its width much longer than its length. In some cases, a transistor has a width to length ratio of up to 2000:14~16.

As for the large width transistor, an active layer 100 having a width greater than a length is formed on a substrate. The active layer 100 is formed of a polysilicon layer and may be formed by crystallizing and patterning amorphous silicon. Also, the active layer 100 has a plurality of heat releasing parts 500 in the active layer 100. Each of the heat releasing parts 500 is formed by cutting out a portion of the active layer 100, through which cut-out portion heat generated from the channel layer is released externally. In this respect, however, since sub-channels are disposed at both sides of the heat releasing parts 500, heat releasing is interrupted.

Measurement of a temperature of the heat released during the operation of the device shows that a temperature of the outermost part of the transistor is lower than that of the internal heat releasing part. The reason is that the sub-channels disposed at both sides of the heat releasing part 500 interrupt the heat releasing.

Thus, in the present invention, a heat releasing path 600 connected to an upper passivation layer (not shown) is additionally formed in the heat releasing part 500. A plurality of heat releasing paths 600 may also be formed in each of the heat releasing parts 500. The heat releasing path 600 is in downward contact with a buffer layer (not shown), which is formed of a silicon nitride film having excellent heat conductivity.

The silicon nitride film has heat conductivity far superior to the silicon oxide film. Thus, in the present invention, the buffer layer is formed to include the silicon nitride layer.

However, if the buffer layer is formed only with the silicon nitride and the silicon film is crystallized, the silicon nitride film is not better than the silicon oxide film in blocking impurity ions. Thus, in the present invention, a double layer of the silicon oxide film and silicon nitride film are formed as the buffer layer. Accordingly, the heat releasing path 600 is connected downwardly to the silicon nitride film and connected upwardly to the passivation layer made of the silicon nitride film having the excellent heat conductivity, thereby facilitating heat releasing.

Figure 3:
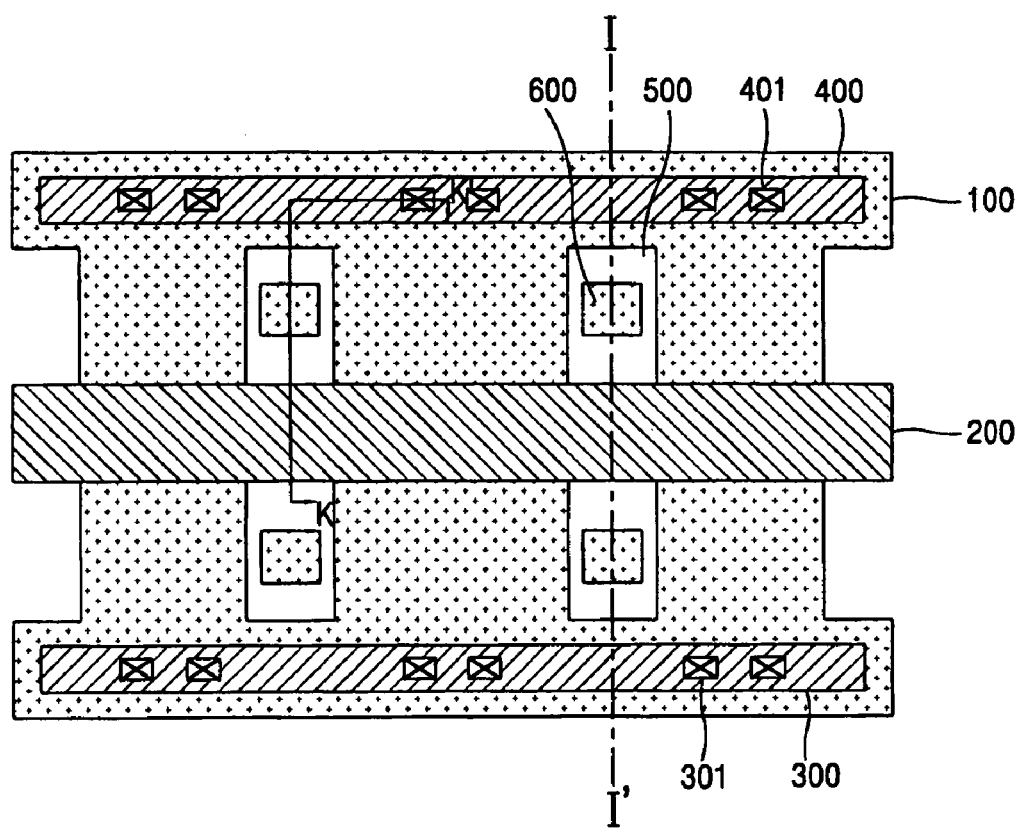
FIG. 3 is a plan view showing a large width transistor in accordance with the present invention.

As shown in FIG. 3, the plurality of heat releasing parts 500 may be formed in the active layer 100 so as to divide the active layer 100 into a plurality of sub-channels. A gate line 200 is formed at the center of the channel in a width direction of the channel with an insulation layer interposed therebetween. The gate line 200 traverses a center of the heat releasing part 500, and supplies the same scan signals to the sub-channels so that the divided sub-channels can operate like one channel.

Source and drain electrodes 300, 400 having a plurality of contact holes 301, 401 are formed in parallel to the gate line 200 at an edge of the active layer 100. The source and drain electrodes 300, 400 are formed on the active layer 100 with an insulation layer (not shown) interposed therebetween, and connected to the active layer 100 through the contact holes 301, 401. When a scan signal is applied to the channel through the gate line 200, the channel is opened, a data signal applied from the source electrode 300 reaches the drain electrode 400 after passing through the channel, and a drive signal is supplied to a pixel part through the drain electrode 400.

Figure 4:
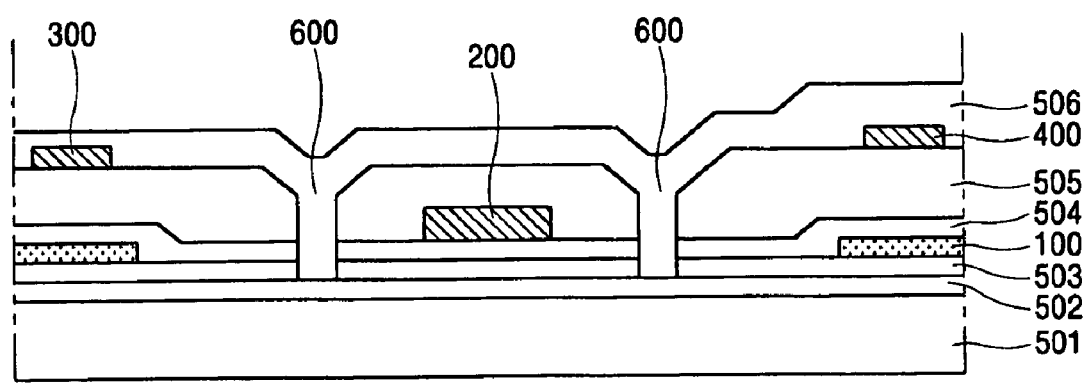
FIG. 4 is a cross-sectional view showing the large width transistor of FIG. 3.

FIG. 4 is a cross-sectional view taken along I–I' of FIG. 3. A structure of the large width transistor in accordance with the present invention will now be described with reference to FIG. 4. A buffer layer consisting of a silicon nitride film 502 and a silicon oxide film 503 is formed on a substrate 501. Conventionally, in order to prevent contamination of the active layer due to an impurity included on the substrate that is diffutilized when the silicon layer is crystallized, the buffer layer is formed only of the silicon oxide film. However, the silicon oxide film is good in impurity ion blocking but is bad in heat conductivity. In case of a high speed operation transistor sensitive to degradation, the transistor can be degraded. Therefore, in the present invention, the silicon nitride film that has far superior heat conductivity to the silicon oxide film is utilized as the buffer layer.

The silicon nitride film, however, contains hydrogen ion. Hydrogen can work as an impurity during the crystallization process. Therefore, in the present invention, the silicon nitride film is utilized as the first buffer layer 502 and the silicon oxide film is used as the second buffer layer 503, thereby having both functions of conductivity characteristics and buffer layer. In other words, the buffer layer is formed as a double layer of the silicon oxide film 503 and the silicon nitride film 502.

Next, the active layer 100 is formed on the first and second buffer layers 502, 503. In FIG. 4, the heat releasing part 500 (FIG. 3) is traversely cut so that the active layer 100 is formed at both sides of the gate line 200. A silicon oxide film is formed as a gate insulation layer 504 on the active layer 100. The gate line 200 is formed on the gate insulation layer 504 in a width direction of the channel.

A silicon oxide film or a silicon nitride film is formed as an interlayer insulation layer 505 at an upper portion of the gate line 200. Since the silicon oxide film has excellent wet etching characteristics and the silicon nitride film has excellent dry etching characteristics, it is preferable to form the interlayer insulation layer 505 as a double layer of the silicon oxide film and the silicon nitride film in consideration of an etching method and an etching rate. The source and drain electrodes 300, 400 are formed on the interlayer insulation layer 505, and a passivation layer 506 is formed of a silicon nitride film on the source and drain electrodes 300, 400.

By using the silicon nitride film as the passivation film 506, heat can be easily released through the passivation film 506, which is connected to the first buffer layer 502 formed at the lower portion of the channel through the heat releasing path 600. Accordingly, heat generated from the channel is released through the passivation film 506 by way of the first buffer layer 502 and the heat releasing path 600.

The method for fabricating the polysilicon LCD device in accordance with the present invention will now be described with reference to FIGS. 5A to 5G. FIGS. 5A to 5G show a process of fabricating a polysilicon LCD device from a view taken along K–K' of FIG. 3.

Figure 5A:
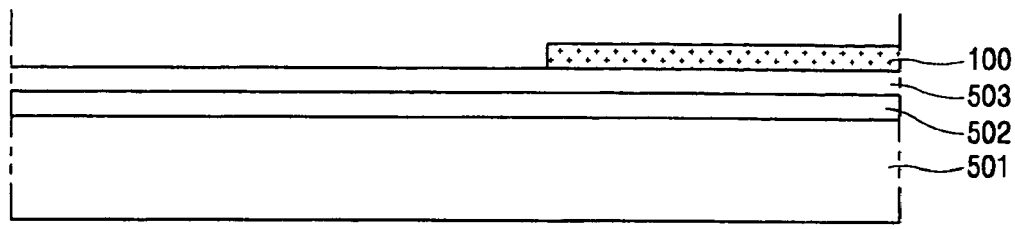
FIGS. 5A to 5G show a process of fabricating a transistor in accordance with the present invention.

First, as shown in FIG. 5A, the first buffer layer 502 is formed on the transparent substrate 501 through a PECVD (Plasma Enhanced Chemical Vapor Deposition) method. Since the silicon nitride film, an insulation film, has excellent heat conductivity characteristics, the first buffer layer 502 can effectively release heat generated from the active layer 100. The second buffer layer 503 is successively formed on the first buffer layer 502. Since the silicon oxide film has excellent impurity blocking characteristics during crystallization of amorphous silicon layer, the second buffer layer 503 serves to prevent diffusion of an impurity contained in the substrate during a process of crystallizing the silicon layer formed on the substrate. Accordingly, the double layer of the silicon nitride film 502 and the silicon oxide film 503 is utilized to prevent diffusion of the impurity that may be possibly generated during the crystallizing process and heat generated while the element is operating.

After that, an amorphous silicon layer (not shown) is formed on the first and second buffer layers 502, 503. The amorphous silicon layer may be formed through the PECVD method. After the amorphous silicon layer is formed, a crystallizing process is performed. Crystallization can be effectively made through a laser annealing method in which the crystallization is possibly performed below a transition temperature of glass used for the substrate 501.

Before the crystallization by laser, a dehydrogenation process may be performed to remove hydrogen contained in the amorphous silicon. The dehydrogenation process removes hydrogen ion contained in the silicon layer by heating the amorphous silicon at a certain temperature. In the present invention, the dehydrogenation process is performed in order to prevent damage of crystalloid because of explosion of hydrogen ion during the crystallizing process and the amorphous silicon is heated at about 400° C.

After the dehydrogenation process is finished, the amorphous silicon layer is crystallized. After the amorphous silicon layer is completely crystallized, the crystallized silicon layer is patterned to form the active layer 100, for example, through a photo-etching process. That is, the active layer 100 is patterned through the following steps: coating a photoresist film on the crystalline silicon layer, exposing the photoresist film by applying a mask, developing the photoresist film, etching the crystallized silicon layer by applying the photoresist film as a mask, and washing. The active layer 100 is thus formed having the heat releasing part 500 therein. As a result, a transistor of the present invention includes the active layer 100 having a plurality of sub-channels divided by the heat releasing part 500.

Figure 5B:
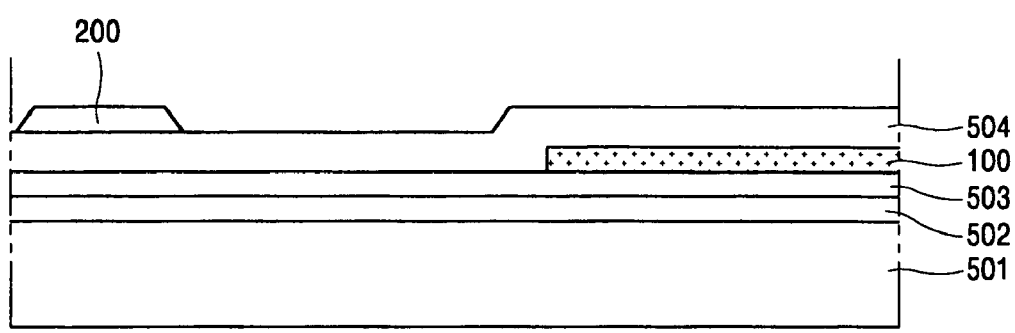

As shown in FIG. 5B, after the active layer 100 is formed, the gate insulation film 504, as the first insulation layer, is formed on the active layer 100. The first insulation layer 504 may be formed of the silicon oxide film through the PECVD method.

After the first insulation layer 504 is formed, a process of forming the gate line 200 on the first insulation layer 504 is performed. The gate line 200 can be made of a conductive metallic material or as a high density-doped silicon layer. As the metallic layer, aluminum or copper having excellent electrical conductivity may be utilized. The gate line 200 is formed by depositing a conductive layer on the first insulation layer 504 through sputtering and applying a photo-etching process. If the gate line 200 is made of metal, it can be effectively patterned through wet etching. The gate line 200 is thus formed on the active layer 100 with the first insulation layer 504 interposed therebetween, passing the center of the active layer in a width direction of the channel.

Figure 5C:
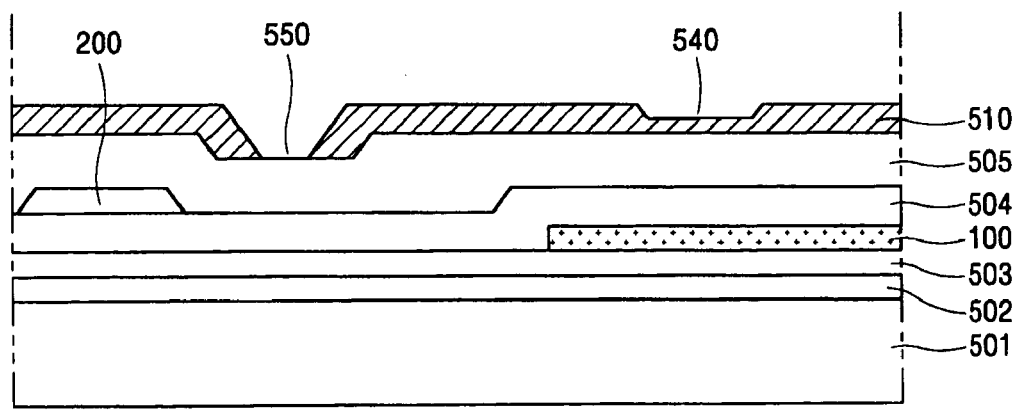

Thereafter, as shown in FIG. 5C, the silicon oxide film 505 is formed as a second insulation layer on the gate line 200. Herein, as the second insulation layer 505, silicon nitride film or the silicon oxide film may be utilized. The silicon oxide film and the silicon nitride film can be applied by both wet etching and dry etching. Since the silicon oxide film has excellent wet etching characteristics and the silicon nitride film has excellent wet etching characteristics, it is preferable to form the second insulation layer 505 as a double layer of the silicon oxide film and the silicon nitride film in consideration of the etching ratio. The present invention has such a structure that the silicon nitride film is stacked on the silicon oxide film in consideration of the etching characteristics.

After the second insulation layer 505 is formed, a process of simultaneously forming the heat releasing path and the contact hole for connecting the active layer 100 and the source and drain electrodes 300, 400 is performed.

First, as shown in FIG. 5C, a photoresist film 510 is coated on the second insulation layer 505 and diffraction-exposed by applying a diffraction mask. At this time, a contact-hole forming region 540 for connecting the source and drain electrodes 300, 400 with the active layer 100 is diffraction-exposed, and the photoresist film 510 of a heat-releasing-path forming region 550 at which the heat releasing path 600 is to be formed is removed to expose the second insulation layer 505.

Figure 5D:
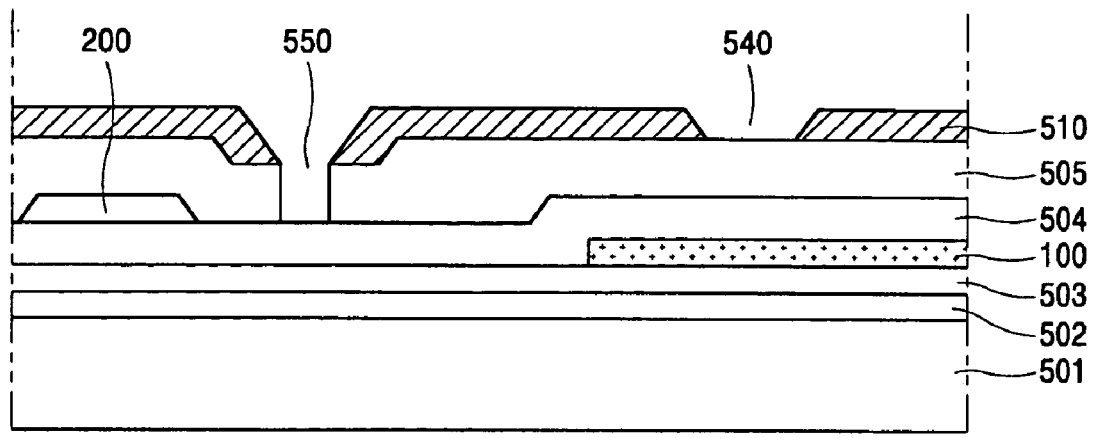

Then, as shown in FIG. 5D, the second insulation layer 505 is dry-etched by applying the diffraction-exposed photoresist film 510 as a mask. While the second insulation layer 505 is being dry-etched, the photoresist film 510 is partially etched simultaneously. The dry etching is performed until the photoresist film 510 of the diffraction-exposed contact-hole forming region 540 is removed. The photoresist film 510 of the contact-hole forming region 540 and the second insulation layer 505 of the heat-releasing-path forming region 550 are simultaneously removed.

Figure 5E:
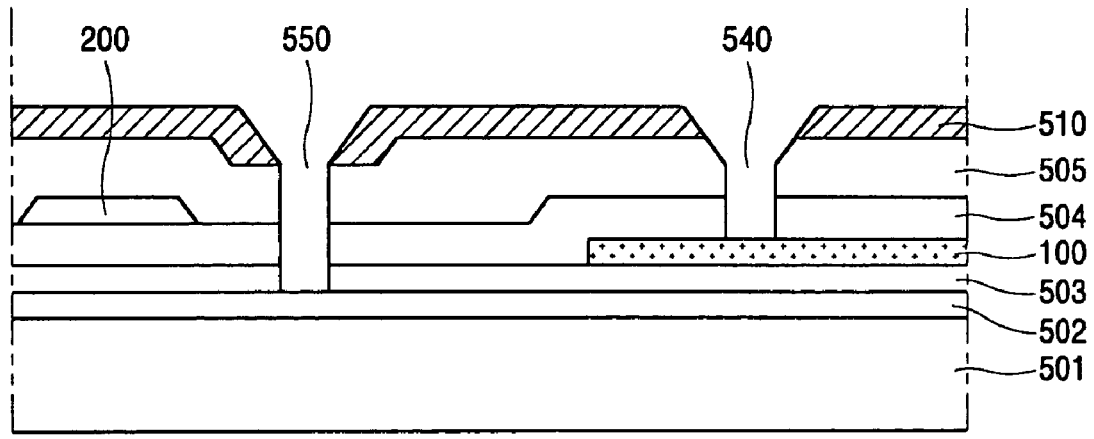

Next, as shown in FIG. 5E, the second insulation layer 505 and the first insulation layer 504 of the contact-hole forming region 540 are etched through wet etching, and at the same time, the first insulation layer 504 of the heat-releasing-path forming region 550 and the second buffer layer 503 are removed. Herein, it is preferable to form the second insulation layer 505 as a double layer of the silicon oxide film and the silicon nitride film according to an etching ratio, or as a single layer of silicon nitride film. As a result, the heat releasing path 600 of FIG. 3 formed through dry etching and wet etching downwardly reaches the first buffer layer 502, and the contact hole 301/401 of FIG. 3 reaches the active layer 100.

Figure 5F:
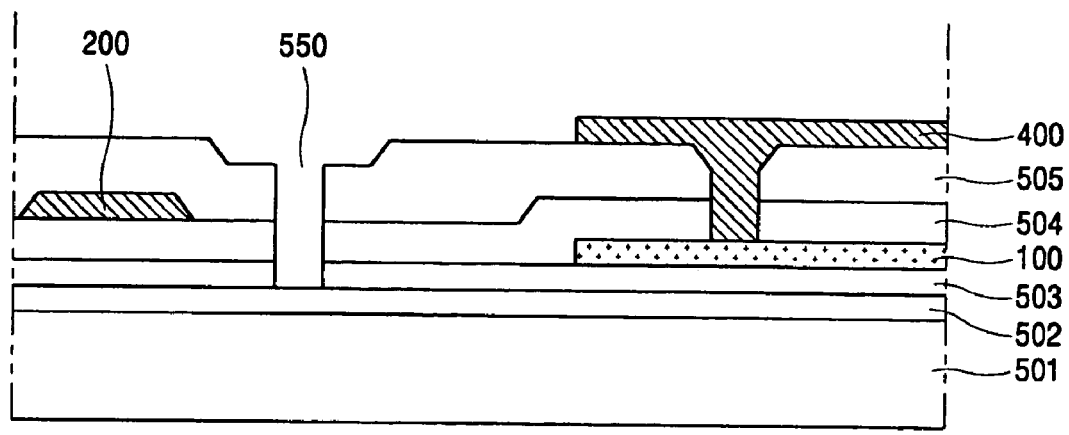
Figure 5G:
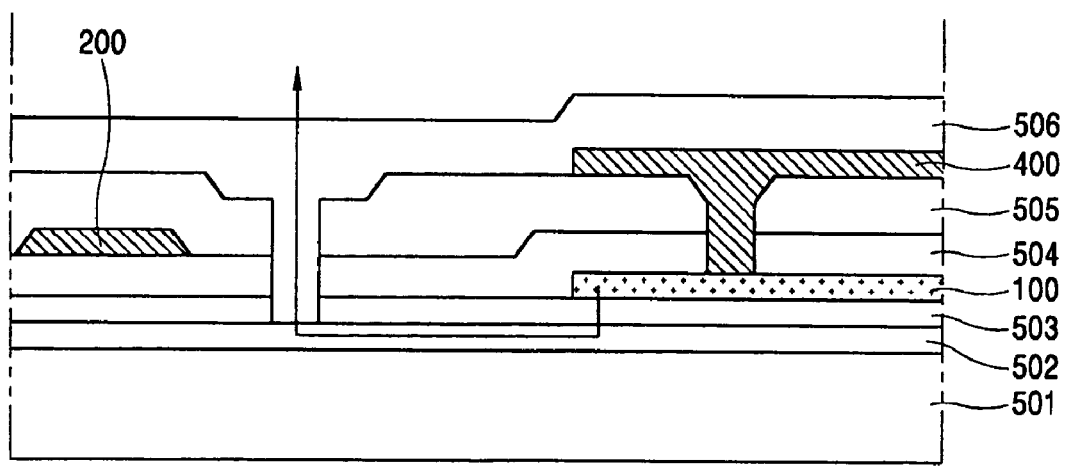

Subsequently, as shown in FIG. 5F, a conductive layer for forming the source and drain electrodes 300, 400 is deposited on the substrate 501, on which the heat releasing path 600 and the contact hole 301/401 have been formed. The conductive layer may be formed through the sputtering method, and fills the heat releasing path 600 and the contact hole 301/401. Thereafter, source and drain electrode patterns are formed through a photo-etching process. That is, a conductive layer of a region other than the source and drain electrode forming part including the heat releasing path 600 is removed by applying a source and drain electrode pattern-formed photoresist film as a mask. FIG. 5F illustrates the drain electrode 400, and the same process may be performed on the source electrode 300.

Next, the second insulation layer 505 with the heat releasing path 600 exposed and the passivation layer 506 formed of the silicon nitride film on the source/drain electrode 300/400 are formed through the PECVD or the like. The passivation layer 506 is the insulation layer having the excellent heat conductivity and connected to the first buffer layer 502 formed of the silicon nitride film through the heat releasing path 600.

Through the above process, the large width transistor is completed. When heat having a high temperature is generated from the channel while the transistor is operated, the heat can be removed by the heat releasing part of the side of the channel, and also can be released externally through the passivation layer 506 formed of the silicon nitride film through the first buffer layer 502 positioned at the lower side of the channel layer and the heat releasing path 600 in contact with the first buffer layer 502.

As so far described, the large width transistor of the present invention has at least the following advantages. Since the large width transistor has the heat releasing part in the active layer and the heat releasing path in the heat releasing part, heat generated while the transistor is operated at a high speed can be effectively removed, so the degradation problem of the device can be solved. Thus, occurrence of a defective device caused by movement of an operation voltage of the device due to the high speed operation can be prevented and a life span of the device can be improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a polysilicon liquid crystal display (LCD) device, comprising:
    forming a buffer layer on a substrate;
    forming an active layer having at least one opening in the buffer layer for serving as a heat releasing part;
    forming a first, insulation layer on the active layer;
    forming a gate line on the first insulation layer;
    forming a second insulation layer on the gate line;
    forming at least one hole as a heat releasing path in an opening of the second insulation layer;
    forming at least one contact hole in the second insulation layer;

forming source and drain electrodes connected to the active layer through the contact hole; and forming a passivation layer in the hole to connect to the buffer layer along the heat releasing path, wherein forming the heat releasing path and the contact hole in the second insulation layer comprises:

forming a photoresist film on the second insulation layer;

forming a heat-releasing-path forming region by partially removing the photoresist film to expose the second insulation layer;

forming a contact-hole forming region by diffraction-exposing the photoresist film;

removing the exposed second insulation layer and the diffraction-exposed photoresist film; and removing portions of the buffer layer and the first insulation layer that correspond to the heat-releasing-path forming region.

2. The method of claim 1, wherein the exposed second insulation layer and the diffraction-exposed photoresist film are removed through dry etching.

3. The method of claim 1, wherein removing portions of the buffer layer and the first insulation layer is performed at the same time as removing portions of the first insulation layer and the second insulation layer, which corresponding to the contact-hole forming region, to expose the active layer.

4. The method of claim 1, wherein the portions of the buffer layer and the first insulation layer that correspond to the heat-releasing-path forming region are removed through wet etching.

5. The method of claim 1, wherein forming a heat-releasing path forming region and forming a contact hole forming region are formed simultaneously by diffraction exposing method using mask including patter for full exposure and pattern for diffraction exposure.

6. The method of claim 1, wherein removing portions of the buffer layer is performed by removing silicon oxide layer of the buffer layer.

7. A method for fabricating a polysilicon LCD device, comprising:

forming a buffer layer on a substrate;

forming an active layer having at least one heat releasing part on the buffer layer;

forming a first insulation layer on the active layer;

forming a gate line on the first insulation layer;

forming a second insulation layer on the gate line;

forming a photoresist film on the second insulation layer;

forming a heat-releasing-path forming region by partially removing the photoresist film to expose the second insulation layer;

forming a contact-hole forming regions by diffraction-exposing the photoresist film;

removing the exposed second insulation layer and the diffraction-exposed photoresist film to form contact holes;

removing portions of the buffer layer and the first insulation layer that correspond to the heat-releasing-path forming region; and forming source and drain electrodes connected to the active layer through the contact holes.

8. The method of claim 7, wherein the exposed second insulation layer and the diffraction-exposed photoresist film are removed through dry etching.

9. The method of claim 7, wherein removing portions of the buffer layer and the first insulation layer is performed at the same time as removing portions of the first insulation layer and the second insulation layer, which corresponding to the contact-hole forming region, to expose the active layer.

10. The method of claim 7, wherein the portions of the buffer layer and the first insulation layer that correspond to the heat-releasing-path forming region are removed through wet etching.

11. The method of claim 7, wherein forming a heat-releasing-path forming region and forming a contact hole forming region are formed simultaneously by diffraction exposing method using mask including patter for full exposure and pattern for diffraction exposure.

12. The method of claim 7, wherein removing portions of the buffer layer is performed by removing silicon oxide layer of the buffer layer.

* * * * *